United States Patent [19]
Resch

[11] Patent Number: 4,503,610
[45] Date of Patent: Mar. 12, 1985

[54] METHOD AND APPARATUS FOR MOUNTING OF ELECTRICAL CONNECTORS

[75] Inventor: Alois R. Resch, Heilbronn-Kirchhausen, Fed. Rep. of Germany

[73] Assignee: Allied Corporation, Morris Township, Morris County, N.J.

[21] Appl. No.: 408,547

[22] Filed: Aug. 16, 1982

[30] Foreign Application Priority Data

Aug. 21, 1981 [DE] Fed. Rep. of Germany ....... 3133155

[51] Int. Cl.³ .......................... H05K 3/00; B23P 19/00
[52] U.S. Cl. ......................................... 29/845; 29/739
[58] Field of Search ................. 29/739, 747, 842, 844, 29/895; 339/64 M, 17 R, 17 C, 17 L, 17 LC, 176 MP; 227/107, 108, 110, 111

[56] References Cited

U.S. PATENT DOCUMENTS 3,550,250 12/1970 Cervenka et al. ................ 29/747 X
3,769,679 11/1973 Kendall ............................. 29/739 X
3,946,477 3/1976 Cobaugh et al. ..................... 29/741
4,045,868 9/1977 Ammon et al. ....................... 29/845
4,053,199 10/1977 Hollyday et al. ............ 339/17 C X
4,216,580 8/1980 Chisholm ............................. 29/842

FOREIGN PATENT DOCUMENTS 849941 9/1960 United Kingdom .................. 29/739

Primary Examiner—Howard N. Goldberg
Assistant Examiner—Carl J. Arbes
Attorney, Agent, or Firm—Roger H. Criss; C. Dennis Lacina

[57] ABSTRACT

A method for mounting elongated pin connectors 10 which have a connector body 11 and pin contact elements 5, wherein the pin contact elements are pressed, preferably in a single operation, into openings 7 of a circuit board 8 and into openings 90 of body 11 arranged below circuit board 8. A pressing tool 1 is provided for contact element combs 2 which have a pilot strip 6 to which contact elements 5 are attached. A clamping section 3 of the tool 1 is designed so that it severs pilot strip 6 when the contact elements are pressed into contact with circuit board 8. The connector body 11 has cams 93,94 adjacent slots 90 for forming an upper surface with their upper sides.

10 Claims, 19 Drawing Figures

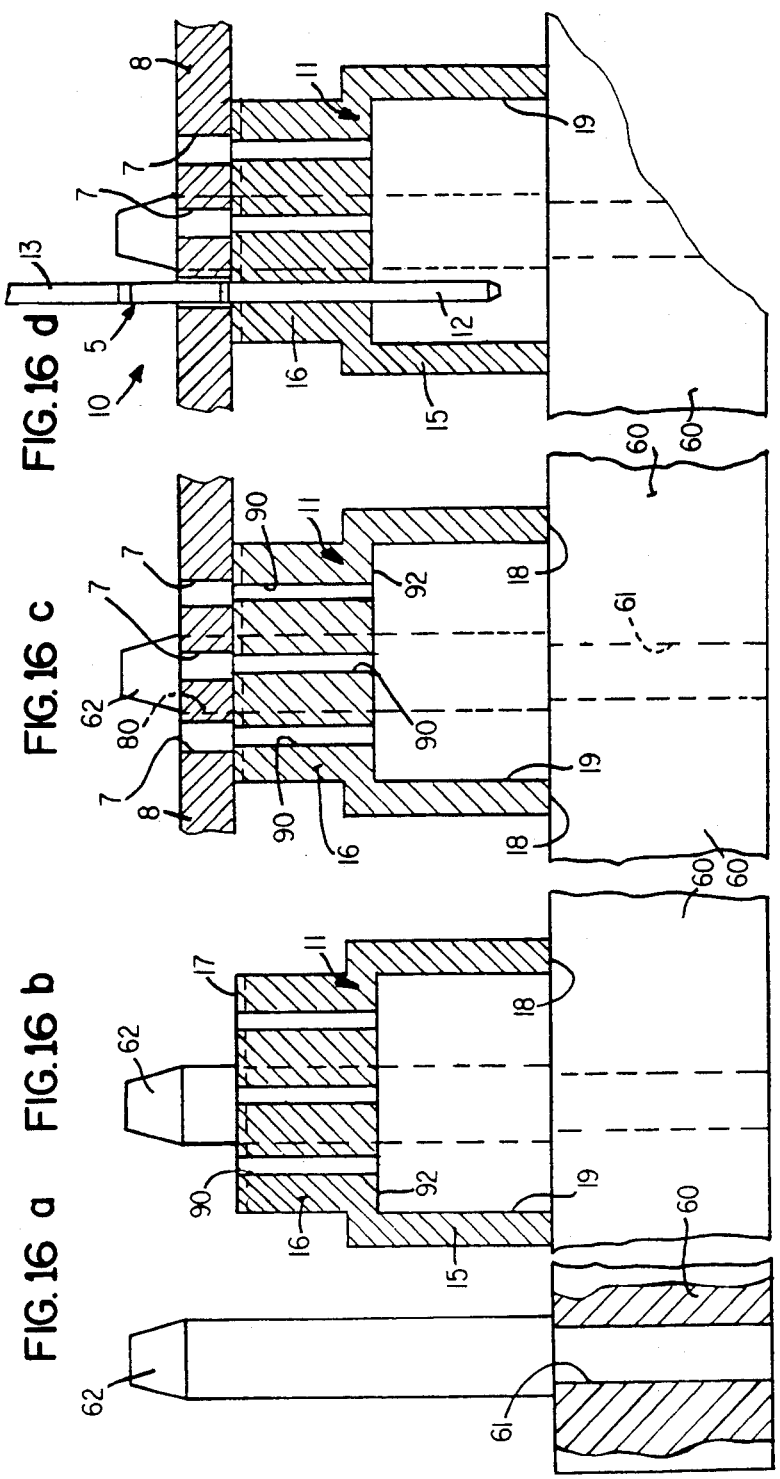

METHOD AND APPARATUS FOR MOUNTING OF ELECTRICAL CONNECTORS

DESCRIPTION

The invention refers to a method and to an apparatus for mounting elongated electrical connectors on a sheet element, for example a circuit board, wherein the sheet element has openings for receiving and holding contact elements of the electrical connectors.

The invention refers in particular to a method and to an apparatus for mounting electric pin connectors, comprising a pin connector body adapted to support contact elements, on a sheet element, for example a circuit board, having openings adapted to receive said contact elements; said contact elements have, preferably, the shape of a pin; each pin comprises at one end a contact pin (knife contact) and at the other end a termination section; a press-fit section is provided between said contact pin and said termination section. The contact elements are preferably arranged in the form of a strip (contact element comb) and can be pressed simultaneously into the respective openings of the sheet element.

A method is already known according to which a plurality of contact springs is arranged together in the form of a strip; thereupon said contact springs are inserted into openings of a circuit board until wider portions, which serve as press-fit portions, come into engagement with the edges of said openings. When mounting a connector body, ribs thereof come into engagement with said strip. By pressing on the upper side of said body, e.g. by means of a stem of a press, the wider portions are pressed into the openings, which are plated with a conductive material. With this known method, it is disadvantageous, among other things, that a counter support plate must be provided for each connector body; said support plate has to be provided with holes for accommodating the wire wrap posts.

According to another known method for mounting press-fit contact elements, a strip comprising a plurality of said contact elements is inserted into a pressing tool, in order to subsequently press the contact elements into the openings of a circuit board by means of said pressing tool. This method requires the use of a suitable hole matrix (i.e. support plate provided with holes), in order to accommodate the leading ends of the contact elements while the press-fit portions are pressed into the openings of the circuit board. Furthermore, after removal of a pilot strip the additional step of mounting the connector body is necessary. Consequently, not only an expensive support plate with holes must be used as support plate for the circuit board, but also a relatively large number of method steps is necessary.

It is an object of the invention to provide a method as well as an apparatus for mounting (elongate) connectors, especially (elongate) pin connectors on a sheet element, specifically a circuit board, in such a manner that a minimum of steps and no support plate with a great number of holes is required.

SUMMARY OF THE INVENTION

In accordance with this invention, there is provided a method for mounting elongate connectors which comprise a connector body and contact elements having contact sections adapted to be inserted into said connectors onto a sheet element having openings adapted to receive said contact elements, characterized in pressing the contact elements into the openings of the sheet element and into openings of the connector body adapted to receive the contact sections, the connector body being arranged below the sheet element.

Also in accordance with this invention, there is provided a pressing tool for at least one contact element comb comprising a plurality of contact elements connected by a pilot strip, the tool comprising a holding section adapted to be arranged in a press and adapted to receive the comb in a clamping portion, whereupon the comb is pressed into openings in a plate, characterized in that the clamping section is designed in such a way that it severs the pilot strip when being moved in a pressing direction for the contact elements.

In addition, this invention provides an insulating connector body having a base section in which slots are provided for mounting contact elements, characterized in that cams are provided adjacent to the slots for forming a support surface with their upper sides.

The pressing tool of the invention, which generally can be used with any method for providing press-fit contacts, has the advantage that the pilot strip which connects the individual contact elements is cleanly and practically automatically removed without requiring an additional tool.

BRIEF DESCRIPTION OF THE DRAWINGS

FIG. 16 shows different procedural steps occurring during the pressing operation of the contact elements into a connector body arranged on a circuit board.

DESCRIPTION OF THE PREFERRED EMBODIMENTS

I. Overview of a preferred embodiment of the method and apparatus of the invention.

Figure 1:
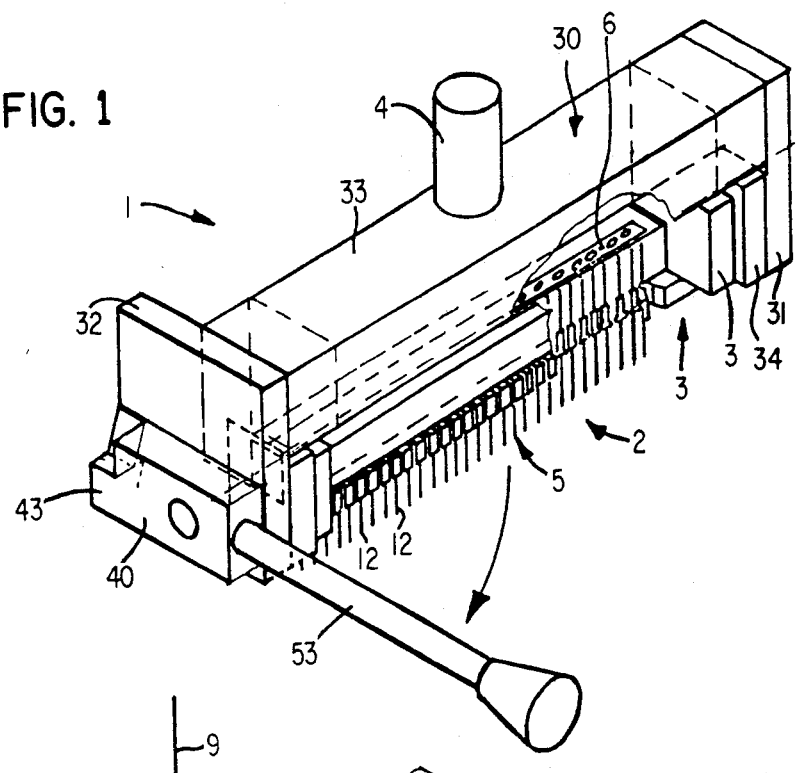
FIG. 1 illustrates a pressing tool designed in accordance with the invention.
Figure 2:
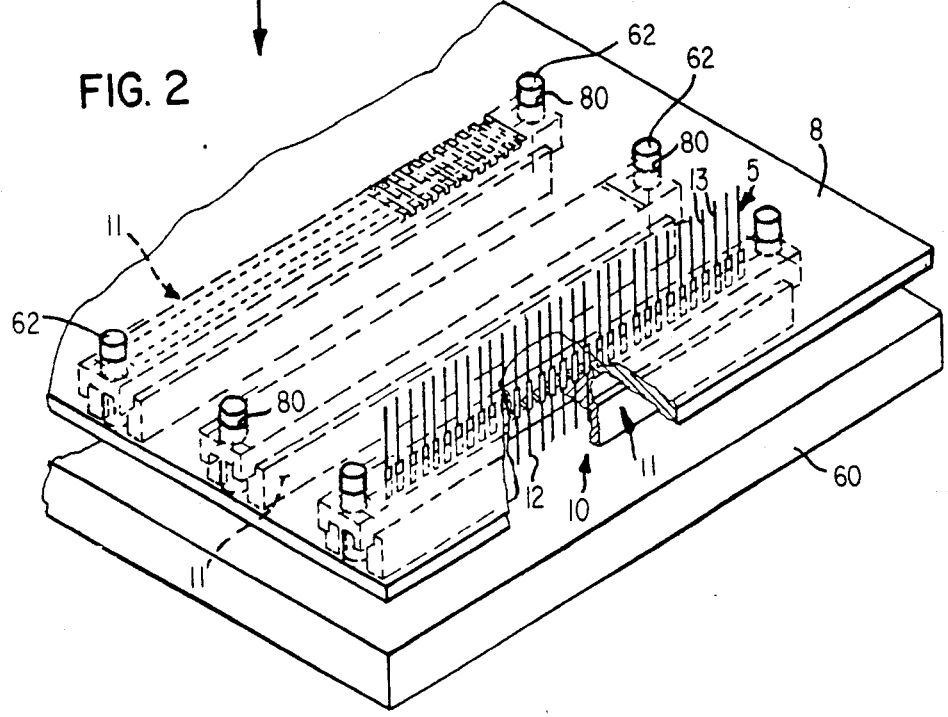
FIG. 2 illustrates a method for forming pin connectors on a circuit board. It should be noted that FIG. 1 and FIG. 2 belong together to the extent that the pressing tool shown in FIG. 1 can be moved in the direction of the arrow 9 present between FIGS. 1 and 2 towards the circuit board shown in FIG. 2.

According to the invention—see FIG. 2 and FIG. 16d—elongated connectors 10, in particular connectors having contact pins (pin connectors) and are efficiently mounted on a printed circuit board 8. None of the figures shows the pin connector 10 completely mounted on a circuit board 8. However, the front part of FIG. 2 and also FIG. 16d gives a clear picture of a pin connector in its final mounting position. FIG. 2 as well as FIG. 16d shows pin contact elements 5 having wire wrap post sections 13 (yet to be described in more detail) projecting upwards while contact pins 12 extend into a pin connector body 11. Said contact pins 12 are adapted to receive, after removal of the circuit board 8 from a support plate 60, socket-type contact elements of a connector equipped therewith. The use of the pressing tool 1 shown in FIG. 1 makes it possible to press a pin contact element comb 2 into the circuit board 8 and simultaneously into a pin connector body 11. (Pressing direction 9 in FIG. 1,2).

II. The pressing tool.

FIG. 1 as well as FIGS. 3–10 disclose a pressing tool 1 designed according to the invention. This pressing tool 1 is adapted to receive and hold a series of pin contact elements 5, which have to be inserted by means of a pressing operation into a circuit board 8 (shown especially in FIG. 2 and FIG. 16) as well as into a pin connector body (insulation body or connector body) which is used for supporting the circuit board 8 during the pressing operation. Preferably pin contact elements 5 are used even though the use of contact elements in general is contemplated. The pin contact elements 5 are provided preferably in the form of a pin contact element comb 2, in the case of which the individual pin contact elements 5 are connected by a pilot strip 6; said pilot strip 6 can be severed by the pressing tool 1 according to the invention without requiring the use of an additional tool.

The pressing tool 1 comprises a frame section of portion 30 in the center of which a holding section 4 is provided in order to allow the mounting of the pressing tool 1 in, for example, a hand press (not shown). The clamping section of portion 3 is pivotally mounted in the frame portion 30 and serves for holding a contact element comb, especially in a pin contact element comb 2 in the receiving position shown in FIG. 8.

Figure 3:
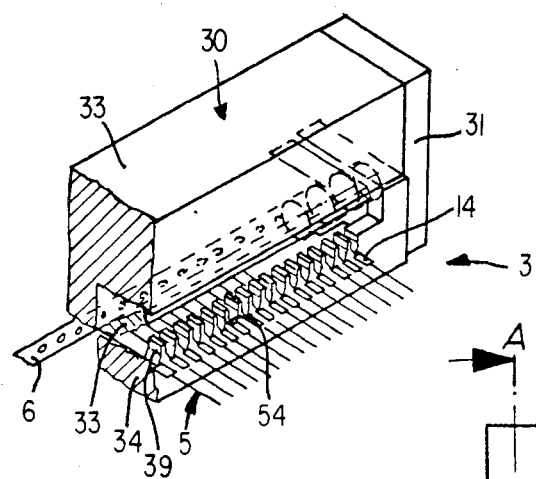
FIG. 3 shows a perspective view of the gripping or clamping portion of the pressing tool with certain parts being cut away.
Figure 4:
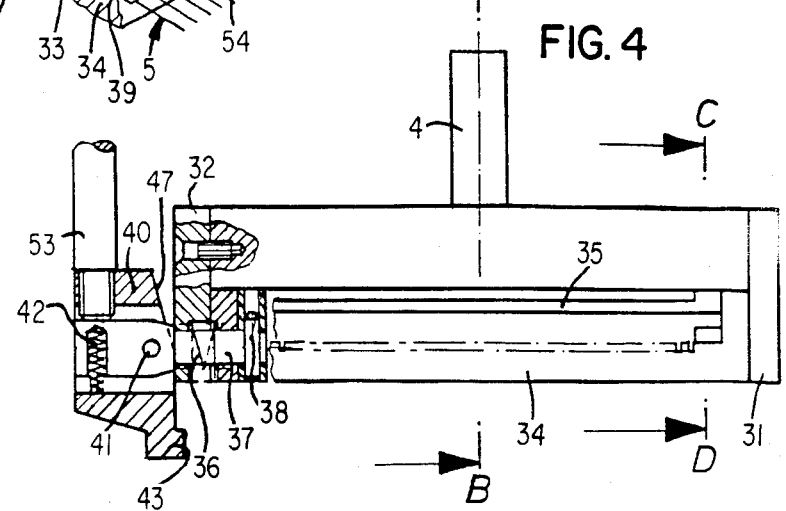
FIG. 4 is a partial front view of the pressing tool shown in FIG. 1 in a position adapted to receive the contact elements.
Figure 5:
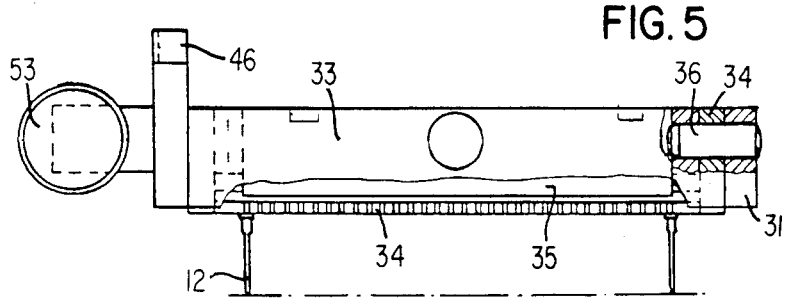
FIG. 5 shows a top view of the pressing tool of FIG. 1.
Figure 6:
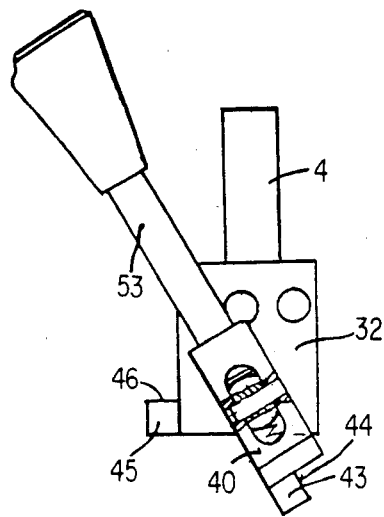
FIG. 6 is a side view of the pressing tool from the left in FIG. 4 in the position adapted to receive the contact elements.
Figure 7:
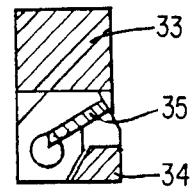
FIG. 7 is a cross sectional view along line C-D in FIG. 4.
Figure 8:
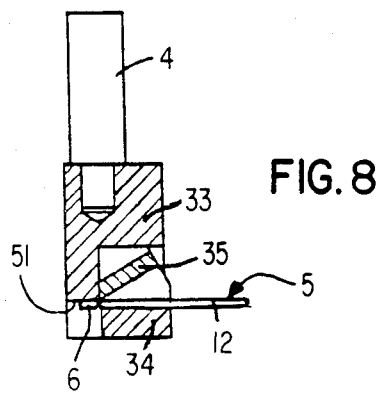
FIG. 8 is a cross sectional view along line A-B in FIG. 4 with a strip of contact elements being received in the pressing tool.
Figure 9:
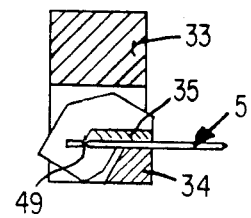
FIG. 9 again shows a cross section along line C-D in FIG. 4 with a strip of contact elements arranged in clamping or gripping position in the clamping portion of the pressing tool.

The frame portion 30 comprises an L-shaped elongated portion 33 with side walls 31,32, with the clamping portion 3 being arranged in the area of the recess of the "L" (see for example FIG. 8). The clamping portion 3 comprises a first clamping element (holder) 34 and a second clamping element (flap) 35. The holder 34 and the flap 35 are pivotally mounted on a bolt 36 fastened in side wall 31 and on a bolt 37 fastened in side wall 32. The holder 34 has a length somewhat longer than the length of the pin contact comb 2 to be received in clamping portion 3. Normally, that is to say in the receiving position of the clamping portion 3, the holder 34 assumes the position shown in FIGS. 3, 7, 8 and 9 due to the effect of a torsion spring 136 which (see FIG. 4) acts in counterclockwise direction. The side walls of the holder 34, which are not designated by reference numerals, limit the pivotal movement in counterclockwise direction by abutting at frame portion 30 as shown in FIG. 3. Guide teeth 39 are arranged over the entire length of holder 34 so as to guide the individual pin contact elements 5 of the pin contact comb 2 into their proper positions in the clamping portion 3. Furthermore, a rubber strip 52 extends behind the guide teeth 39; said rubber strip 52 is inserted into the upper side of holder 34 and is adapted to come into contact with the contact elements 5. Alternatively, the rubber strip can be inserted into the bottom side of flap 35.

While the holder 34 is pivotally mounted on bolt 37, the pivotable flap 35 is connected in a nonrotatable manner with bolt 37 by means of a pin 38. The bolt 37 (see specifically FIG. 4) extends beyond the side wall 32 and supports a lever 53. Lever 53 is connected with bolt 37 by means of a pivot element 40. The pivot element 40 is pivotable about pin 41 which extends through pivot element 40 and bolt 37. Pivot element 40 is kept in the position shown in FIG. 4 by means of a compression spring 42. An abutment element 43 is provided on the pivot element 40 diametrically opposite to the fastening position of lever 53. Abutment element 43 comprises detent surface 44. The detent surface 44 is adapted to cooperate with an abutment surface 46 of a detent means 45 of the side wall 32 in the manner shown in FIG. 1. The spring 42 holds the pivot element 40 in the position shown in FIG. 1. A bevel 47 (see FIG. 4) permits the pivotal movement of lever 53 in lengthwise direction of the frame portion 30 so as to allow a movement out of the rest position shown in FIG. 1.

Front surfaces 54 of adjacent teeth 39 (see FIG. 3) of the holder 34 form contact surfaces for the press-fit sections 14 of the pin contact elements 5. The front surfaces 54 limit the insertion of the pin contact element comb 2 into the clamping portion 3 such that the individual contact elements 5 are aligned uniformly and are arranged with their intended severing portions 49 under an elongated edge 50 (FIG. 10) of the elongated portion 33. In addition, the front surfaces 54 are used to transmit the pressing force to the individual contact elements 5 at the time the pressing operation is carried out. The pilot strip 6 of the contact elements 5 is arranged under a counter pressure surface 51 formed by clamping portion 3 (FIG. 8) provided that the contact element comb 2 is properly inserted into its mounting or receiving position. Surface 51 takes up the pressure of the holder 34 during the press-in operation.

III. Before the method according to the invention is explained, some details of the invention, namely, the mounting plate 60, the circuit board 8, the pin contact element comb 2 and the pin connector body will be explained.

Mounting or support plate 60 (FIGS. 2 and 16) is used with the method and apparatus of the invention for supporting the circuit board 8. Mounting plate 60 is generally somewhat larger than the circuit board 8 which has to be equipped with pin connector bodies 11. The pin connector bodies 11 to be mounted on the circuit board 8 are arranged (see FIG. 2) with a desired distance from each other on the mounting plate 60. The pin connector bodies support the circuit board 8. FIG. 16a shows bore holes 61 in the mounting plate 60 on both sides so as to receive mounting and centering pins 62 (FIG. 2 and 16). The pin connector bodies 11 are arranged with their diametrically provided fastening openings 70 (FIG. 11) on the mounting pins 62. Openings 80 (FIG. 2,16) provided on opposite sides in the circuit board 8, again arranged with a predetermined distance, permit the insertion of the circuit board 8 onto the mounting pins 62 in a supporting relationship with the pin connector bodies 11.

Furthermore, openings 7 plated with an electrically conductive material are provided in the circuit board. These openings 7 are best to be recognized in FIGS. 16c and 16d.

Figure 11:
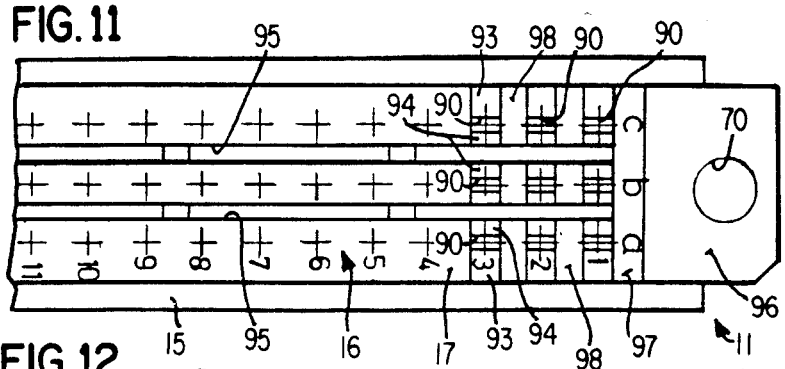
FIG. 11 shows a partial top view of an elongated pin connector body according to the invention.

When the circuit board 8 is arranged on the mounting plate 60 in the described manner, the openings 7 are then found in alignment with corresponding slots (openings) 90 (FIG. 11) of the pin connector bodies 11. When using a pin connector body 11 with, for example, three rows a,b,c of slots as shown in FIG. 11, three rows of openings 7 are provided in the circuit board 8 in corresponding positions. For reasons of simplicity the openings 7 are not shown in FIG. 2.

The circuit board 8 consists generally of an insulating material and the contact elements 5 are intended to be pressed into the above-mentioned openings 7. A simple circuit board or even a circuit board of the so-called stacked design can be used with the invention. The circuit board can support electric components and can be a printed circuit board. The circuit board can also be a back plane circuit board. Instead of using the expression "circuit board", one can more generally refer to a "receiving element for elongate connectors" or to a "sheet element".

Figure 13:
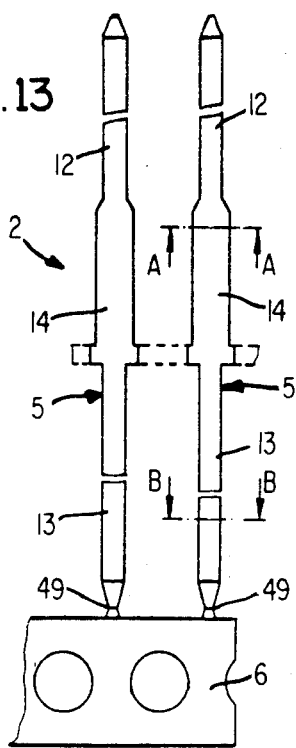
FIG. 13 is a partial view of a strip of pin contact elements (pin contact element comb)
Figure 14:
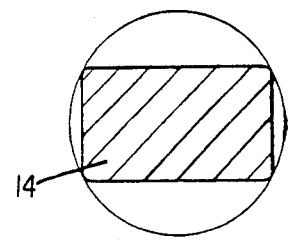
FIG. 14 shows a cross section along line A—A in FIG. 13 together with a part of the circuit board forming an opening.
Figure 15:
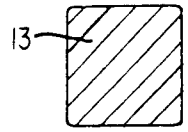
FIG. 15 is a cross section along line B—B in FIG. 13.

FIG. 1 schematically shows a pin contact element comb 2, and FIG. 13 shows a small section of it, namely, two pin contact elements 5 connected with each other by pilot strip 6. Each pin contact element 5 comprises a press-fit section 14 in its middle area and arranged at opposite ends a pin contact or contact pin 12 (in general terms a contact section) and a wire wrap post section 13 (in general terms a termination section). In the preferred embodiment shown in the drawing, each pin contact element 5 is connected via its wire wrap post section 13 with pilot strip 6, and the contact section 12 is a contact pin or knife contact. The presence of intended severing portions 49 between the termination section 13—preferably the wire wrap post sections—and the pilot strip 6 facilitates the separation of the pilot strip 6.

Figure 12:
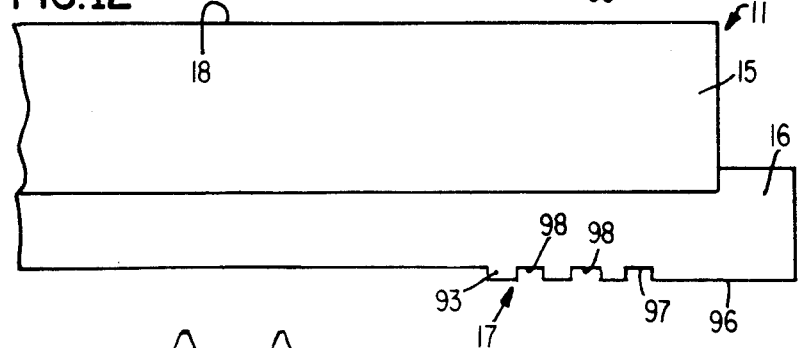
FIG. 12 shows a partial side view of the pin connector body of the invention shown in FIG. 11.

The pin or plug connector body 11 (insulating body) according to the invention is shown especially in FIGS. 11 and 12 as well as in FIG. 16. Since, preferably, a pin connector body 11 is used according to the invention and is also shown in the drawing, the latter expression will be used in the following description. The pin connector body 11 is made of a plastic material and comprises a pin connector body wall section 15 and a pin connector body base section 16. The wall section 15 is formed by two parallel walls which form a pin connector body space 19 which is open at its two narrow sides. In the base section 16, the already mentioned fastening openings 70 are formed diametrically opposite to each other. The base section 16 is penetrated by a plurality of slots 90, already mentioned, which extend between a bottom side 17 and an inner-upper side 92. The slots 90 can be arranged in the rows a,b,c, (see FIG. 11) already mentioned. For example, 32 slots (or more or less) can be arranged in each row a,b,c. According to the invention, the bottom side 17 of the pin connector body 11 is not plane but exhibits cams 93,94 adjacent to the slots 90. These cams are shown only for the rows 1, 2 and 3 in FIG. 11. Furthermore, grooves 95 extend in a lengthwise direction between each two rows of slots 90. Ledges 96 are formed by grooves 97 on both sides of the pin connector body 11 and extend around the fastening openings 70. The ledges 96 are of the same height as the cams 93,94. The pin connector body 11 thus forms a smooth but interrupted support surface with its bottom side 17 (which is directed upward in FIG. 2 and 16) for the circuit board 8 so that air may escape when bottom side 17 contacts the circuit board 8. So as to form cams 93,94, grooves 98 extend transversely to grooves 95.

IV. Carrying out of the Method according to the Invention.

In order to equip a circuit board 8—see FIG. 2—with pin contact element combs 2, the pin connector bodies 11 are arranged at the desired locations on centering pins 62 which were already inserted in mounting plate 60. The pin connector bodies 11 contact with their upper side 18 the mounting plate 60. Thereupon, the circuit board 8 is arranged on the centering pins 62 and comes into contact with the bottom side 17 of the pin connector bodies 11 which are provided with the cams 93 and 94. The just described procedure assures that the openings 7 in the circuit board 8 are aligned with the slots 90 in the pin connector bodies 11.

The mounting plate 60 is now mounted on the table of a press (not shown) in alignment with the press-in tool 1 arranged in the upper part of the press. The pin contact element comb 2 of the type shown in FIG. 13 is inserted into the pressing tool 1 such that the pin contact element comb 2 lies with its abutment surfaces of the press-fit sections 14 at the front surfaces 54 of teeth 39 (see FIG. 3). Then the movable flap 35 is moved by about 30° by means of lever 53 until the pin contact element comb 2 is firmly clamped in clamping portion 3. The holder 34 provides a counterpressure support due to the action of the torsion spring 136.

Figure 10:
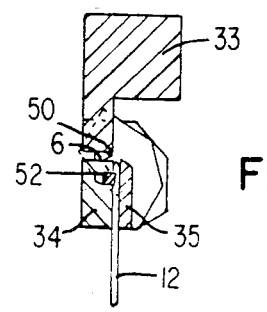
FIG. 10 is a schematic cross section along line A-B in FIG. 4, this time with the clamping portion arranged in pressing position.

By pivoting the lever 53 further by 90°, the pin contact element comb 2 is brought into the vertical position shown in FIG. 10. During this pivotal movement, the pin contact elements 5 are severed from the pilot strip 6 by action of the counterpressure surface 51. The rubber strip 52 compensates for a possible deflection of the flap 35 during the clamping procedure. Since the detent surface 44 of abutment 43 comes into engagement with abutment surface 46 of detent means 45, the contact elements which were already severed from the pilot strip 6 are fixedly clamped in a vertical position, with the contact pins 12 (contact sections) of the contact elements 5 pointing downwardly. The holder 34 which is pressed against flap 35 by torsion spring 136 serves as a counter support. The invention allows the repeated precise positioning of pin contact elements in a vertical position.

By actuating the press (not shown), the entire pressing tool 1 is moved downwardly so as to press the pin contact elements (with the pin sections first) to a certain degree into the aligned openings 7 of the circuit board 8, while at the same time, the insertion of the pin contact elements into the pin connector bodies 11, which are arranged below the circuit board 8, occurs.

After the press-in operation is carried out, the flap 35 is opened by moving the lever 53 against the force exerted by compression spring 42, the severed pilot strip 6 is released and drops. The pilot strip 6 can be guided into a box over a chute. Subsequently, another pin contact element comb 2 can be pressed into circuit board. Similar operations are continued until all the desired contact elements are inserted.

I claim:

1. A method of assembling an electrical connector assembly comprising a connector body of the type having a mating face, a terminating face, and an array of slots extending between the faces, a sheet element having an array of openings therethrough, and a plurality of contact elements each having a first portion thereof disposed in only one said opening and a second portion thereof disposed in only one said slot, the method being characterized by supporting the terminating face of said connector body on a mounting plate, positioning the sheet element above the connector body so that each said array of said slots and openings are aligned and the sheet element is supported on said mating face, and pressing each of the contact elements into respective ones of said slots of the sheet element and into openings of the connector body below said sheet element whereby each said contact element has its first portion disposed in the one said opening and its second portion disposed in the one said slot.

2. A method according to claim 1 characterized by simultaneously pressing said contact elements into said openings and slots in a single pressing operation.

3. A method according to claim 2 wherein the first portion and the second portion of each said contact element comprises, respectively, a press-fit section having a dimension adapted to interference fit within said opening and a termination section adapted to be retained within the slot.

4. A method according to claim 3 wherein said contact elements are connected by means of a pilot strip whereby to form a contact element comb.

5. A method according to claim 4 further characterized by the step of pressing in one operation a plurality of contact elements forming a row of contacts into both said openings and slots, the contact pins being first moved into the openings of the sheet element and then into the slots of the connector body.

6. A method according to claim 5 wherein the contact elements are inserted into a press-in tool while they are connected by said pilot strip, and further including the steps of severing said pilot strip from said contact elements within said press-in tool, supporting said contact elements in said tool, and then pressing said elements into respective ones of said openings and slots.

7. A pressing tool for at least one contact element comb of the type comprising a plurality of contact elements connected by a pilot strip with each of the elements being laterally separated by a like distance separating a respective plurality of openings in a plate, said tool being adapted to receive said contact element comb and press said comb into respective openings of said plate, said tool being characterized by a frame portion, a clamping portion pivotally mounted to said frame portion, said clamping portion being designed in such a way that it severes the pilot strip when being moved in a pressing direction for the contact elements and comprising a first clamping element in the form of a holder and a second clamping element in the form of a flap, both of said elements being pivotally mounted on said frame portion for movement between a receiving position, a clamping position and a pressing position, and a spring for biasing said holder into its receiving position.

8. A pressing tool according to claim 7 wherein said clamping portion is pivotally arranged in such a way that when moving from a receiving position for the contact elements into the pressing direction, the pilot strip is separated from the contact element while the contact elements remain firmly clamped in the clamping portion for the pressing operation.

9. A pressing tool according to claim 8 wherein said contact elements are in the form of pin contact elements and said plate is a circuit board, and wherein said clamping portion receives the contact comb in a substantially horizontal position and is pivotable by about 90° to severe said pilot strip and to provide said contact element comb and the pin contact elements in a substantially vertical position with respect to said circuit board.

10. A pressing tool according to claim 9 wherein said holder is provided with guide teeth, the front surfaces of which form a stop means for said pressfit sections of the pin contact elements to permit insertion of the pin contact element comb only so far that the intended severing portions of the elements are arranged adjacent to the inner edge of the frame portion.

* * * * *